United States Patent
Wolde-Giorgis et al.

(10) Patent No.: US 8,552,306 B2
(45) Date of Patent: Oct. 8, 2013

(54) ASSEMBLY AND PRODUCTION OF AN ASSEMBLY

(75) Inventors: Daniel Wolde-Giorgis, Leinfelden-Echterdingen (DE); Thomas Kalich, Lichtenstein (DE)

(73) Assignee: Robert Bosch GmbH, Stuttgart (DE)

( * ) Notice: Subject to any disclaimer, the term of this patent is extended or adjusted under 35 U.S.C. 154(b) by 206 days.

(21) Appl. No.: 12/671,153

(22) PCT Filed: Jul. 4, 2008

(86) PCT No.: PCT/EP2008/058705
§ 371 (c)(1),
(2), (4) Date: Jun. 9, 2010

(87) PCT Pub. No.: WO2009/019091
PCT Pub. Date: Feb. 12, 2009

(65) Prior Publication Data
US 2010/0252312 A1    Oct. 7, 2010

(30) Foreign Application Priority Data

Aug. 9, 2007  (DE) .................. 10 2007 037 538

(51) Int. Cl.
*H05K 1/16*  (2006.01)
(52) U.S. Cl.
USPC .......................................... 174/260; 174/255
(58) Field of Classification Search
None
See application file for complete search history.

(56) References Cited

U.S. PATENT DOCUMENTS

| | | | | |
|---|---|---|---|---|
| 5,644,163 A * | 7/1997 | Tsuji | | 257/706 |
| 5,686,758 A * | 11/1997 | Arai et al. | | 257/693 |
| 6,690,583 B1 * | 2/2004 | Bergstedt et al. | | 361/763 |
| 7,145,222 B2 * | 12/2006 | Gai | | 257/667 |
| 2003/0020159 A1 | 1/2003 | Schwarzbauer | | |
| 2004/0056346 A1 | 3/2004 | Palm et al. | | |
| 2005/0127134 A1 | 6/2005 | Lu et al. | | |
| 2005/0255635 A1 | 11/2005 | Starkston | | |
| 2006/0267218 A1 * | 11/2006 | Hozoji et al. | | 257/782 |
| 2006/0278961 A1 * | 12/2006 | Gai | | 257/667 |

FOREIGN PATENT DOCUMENTS

| | | |
|---|---|---|
| DE | 34 14 065 | 12/1985 |
| DE | 43 32 752 | 3/1995 |
| DE | 10 2005 0587 | 6/2007 |
| EP | 1 772 900 | 4/2007 |
| GB | 2 195 825 | 4/1988 |
| JP | 2-246233 | 10/1990 |
| JP | 5-47810 | 2/1993 |
| JP | 9-45814 | 2/1997 |
| JP | 9-283544 | 10/1997 |
| JP | 2002-353255 | 12/2002 |
| JP | 2005-101353 | 4/2005 |
| JP | 2005-136375 | 5/2005 |
| JP | 2006-352080 | 12/2006 |

* cited by examiner

*Primary Examiner* — Ishwarbhai Patel
(74) *Attorney, Agent, or Firm* — Kenyon & Kenyon LLP

(57) ABSTRACT

An assembly having a substrate and at least one component fastened thereon by sintering using a sintering agent, in particular sintering paste. The sintering agent is situated in a recess of the substrate that accommodates at least some areas of the component. A method for producing an assembly having a substrate and at least one component fastened thereon by sintering using a sintering agent, in particular sintering paste. The sintering agent is brought into a recess of the substrate that accommodates at least some areas of the component.

8 Claims, 2 Drawing Sheets

ASSEMBLY AND PRODUCTION OF AN ASSEMBLY

FIELD OF THE INVENTION

The present invention relates to an assembly having a substrate and having at least one component fastened thereon by sintering using a sintering agent, in particular sintering paste. The present invention further relates to a method for producing an assembly having a substrate and having at least one component fastened thereon by sintering using a sintering agent, in particular sintering paste.

BACKGROUND INFORMATION

In prior assemblies, during production, the sintering agent is first applied onto the planar substrate. Subsequently, the component is applied onto the sintering agent, or is pressed into the sintering agent; here, adequate pre-fixing of the component is not ensured due to insufficient adhesive properties. The sintering process itself requires application of pressure in order to ensure sufficient contact of the colloids contained in the sintering agent with one another, as well as with the substrate and the component. The pressure is realized using a soft silicone plunger having component-specific impressions. Using the plunger, the assembly made up of the substrate, the sintering agent, and the component is oriented to one another and fixed for the sintering process. The impression of the plunger enables an isostatic/quasi-isostatic application of pressure to the component. However, due to the poor adhesive properties of the sintering paste it is possible for the component to slide out of its provided position before or during the introduction of the pressure force, and/or for a portion of the sintering agent to be squeezed out from the location to be joined and to adhere to the plunger, causing an increased reject rate and carrying off of sintering agent on the plunger.

SUMMARY OF THE INVENTION

According to the present invention, it is provided that the sintering agent is situated in a recess of the substrate that accommodates at least some areas of the component. Thus, it is provided that the substrate has a recess that accommodates at least some areas of the component, the sintering agent for the sintering or fastening process being situated in the recess. Because the component is then situated in the recess of the substrate, it is possible to position the component on the substrate so that this component does not leave its provided position before or during the sintering process. Furthermore, the formation of the recess in the substrate prevents the sintering agent introduced into the recess from being squeezed out from the join point when the pressure force is introduced, and/or from adhering to the plunger that applies the pressure force.

Particularly preferably, for this purpose the recess has an outline that corresponds essentially to the contour of the component. Advantageously, the recess has areas (receptacle spaces) into which excess sintering agent can escape when the pressure force is introduced. For the application of the pressure force, a plunger is advantageously used having a planar plunger surface, the plunger surface preferably yielding elastically so that a uniform (isostatic) pressure distribution is ensured. The positioning and orientation of the component is ensured by the recess.

Advantageously, the sintering agent is a silver sintering paste that is appropriately made up of chemically stabilized silver colloids. Alternatively, the sintering agent is a solid sintering agent. During the joining or sintering process, the stabilized components of the paste are burned out, so that the silver colloids come into direct contact with one another and with the material of the component and of the substrate. Due to solid-body diffusion processes, a highly temperature-stable compound results already at temperatures of 250° C., said compound having significantly more advantageous properties than for example tin-silver soldering compounds with regard to its heat conductivity, stability, plasticity, and brittleness. The silver sintering compound can be processed at temperatures that are significantly lower than its melting point.

According to a development of the present invention, the component is an electrical/electronic component, in particular a power semiconductor such as a MOSFET.

In addition, it is provided that the substrate is a pressed screen or a circuit board, in particular a DBC (direct bonded copper) substrate.

In the method according to the present invention, the sintering agent is introduced into a recess of the substrate that accommodates at least some areas of the component. Thus, it is provided that first the sintering agent is introduced into the recess and subsequently the component is introduced into the recess, the component being placed onto or pressed into the sintering agent. Of course, it would also be conceivable for the component to carry the sintering agent along with it.

In order to apply a sintering pressure, advantageously a plunger having a planar plunger surface is used, the plunger surface being fashioned so as to be elastically deformable, so that when the sintering pressure is applied at least some areas of the component can be pressed into the plunger. This ensures on the one hand that a uniform pressure distribution is applied to the component, and shifting of the component is prevented. Advantageously, a silicone plunger is used for this purpose.

Advantageously, the recess is produced such that its outline corresponds essentially to the contour of the component, so that the component cannot be displaced out of the recess and, through the outline of the recess, can be uniquely oriented or positioned on the substrate.

Advantageously, as a sintering agent a silver sintering paste is used that appropriately has silver colloids.

Furthermore, it is provided that as a component an electric/electronic component, in particular a power semiconductor such as a MOSFET or a IGBT (Insulated Gate Bipolar Transistor=bipolar transistor having an insulating gate electrode) is used.

Finally, it is provided that as a substrate a pressed screen or a circuit board is used. That is, the component is situated in a recess of the pressed screen or circuit board in which the sintering agent, or the preferred silver sintering paste, has previously been placed. When pressure is applied to the component using the plunger, which is advantageously fashioned as a silicone plunger, the silver sintering paste, or sintering agent, cannot exit onto the substrate in an undefined manner, so that for example no sintering agent remains suspended on the plunger.

DETAILED DESCRIPTION

Figure 1:
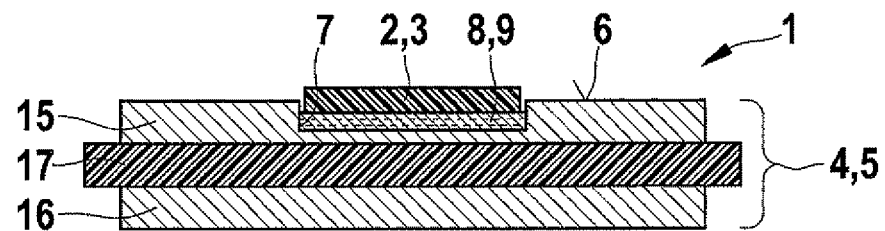
FIG. 1 shows an exemplary embodiment of an advantageous assembly.

FIG. 1 shows, in a schematic exemplary embodiment, an advantageous assembly 1. Assembly 1 includes a component 3, fashioned as power semiconductor 2, as well as a substrate 5 fashioned as circuit board 4 (DBC=direct bonded copper). Power electronics place higher demands on the thermal, thermomechanical, and electrical properties of design and connection technology. In particular, the connection of a power semiconductor (2) to a substrate (5) is today subject to permanent temperature loads of up to 175° C. Currently, most of these connections are realized by a soldered connection made of a tin-silver alloy. However, at higher temperatures the mechanical properties of such connections become weaker, which, in interaction with various coefficients of expansion of the parts being joined (substrate 5 and component 3), can cause creepage of the solder and ultimately formation of cracks in the solder layer. In addition, the various alloy components can cause the formation of brittle phases that further accelerate this process. It is indeed conceivable to use solder alloys having a higher melting point, but this results in a correspondingly higher processing or connecting temperature. Such temperatures required for connecting can cause the destruction of the components that are to be connected.

In the case of the so-called silver sintering compounds (low-temperature connection technique), which can be produced at significantly lower temperatures relative to their melting point, instead of the above-named solder a pastelike sintering agent can be used that is made up of chemically stabilized Ag colloids.

Advantageous assembly 1 permits the secure production of a silver sintering compound that enables simple positioning of component 3 on substrate 5 and in addition prevents a carrying off of sintering agent.

For this purpose, substrate 5 has on a surface 6 a recess 7 into which component 3, or power semiconductor 2, can be introduced. In recess 7, there is situated a sintering agent 8, fashioned as silver sintering paste 9, so that during assembly component 3 is applied onto silver sintering paste 9 in recess 7.

Figure 3:
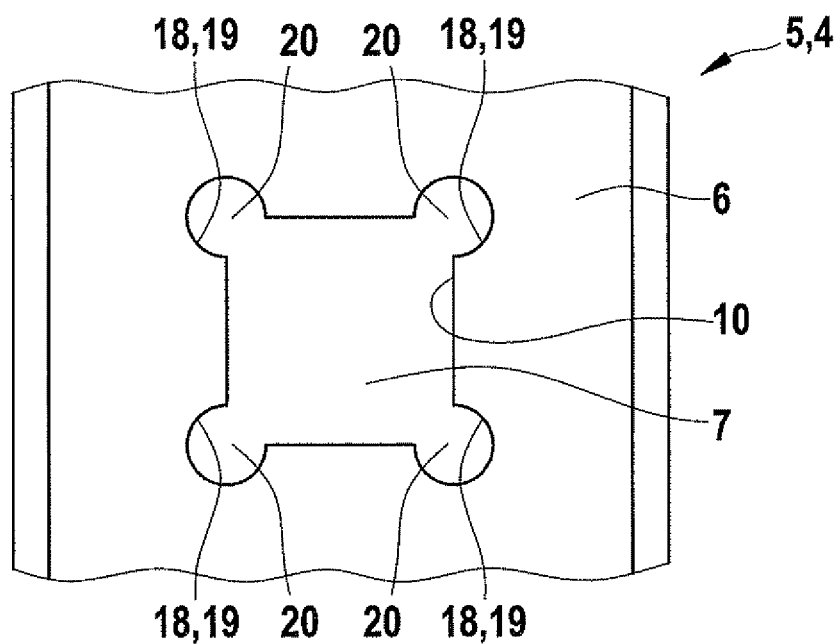
FIG. 3 shows a substrate of the assembly.

FIG. 3 shows substrate 5, in a top view of surface 6. Recess 7 fashioned in substrate 5 has an essentially quadratic outline 10 that advantageously essentially corresponds to the contour of component 3/power semiconductor 2, so that component 3 is positioned and oriented on substrate 5 by being brought into recess 7, as is shown in FIG. 4.

Figure 4:
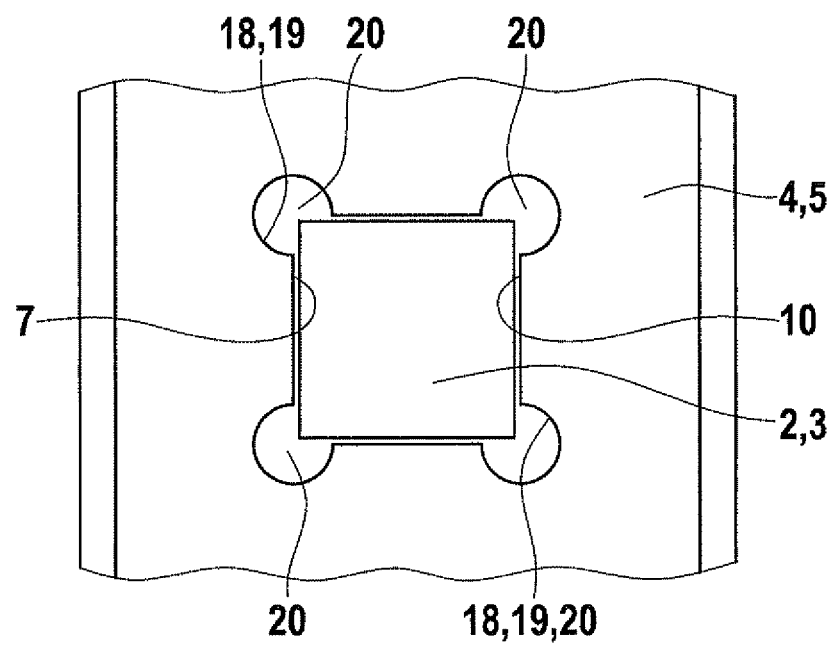
FIG. 4 shows the substrate of the assembly equipped with a component.

FIG. 4 shows substrate 5 from FIG. 3, having power semiconductor 2, or component 3, brought into recess 7. Here, the orientation of component 3 on substrate 5 via recess 7 can be seen.

Figure 2:
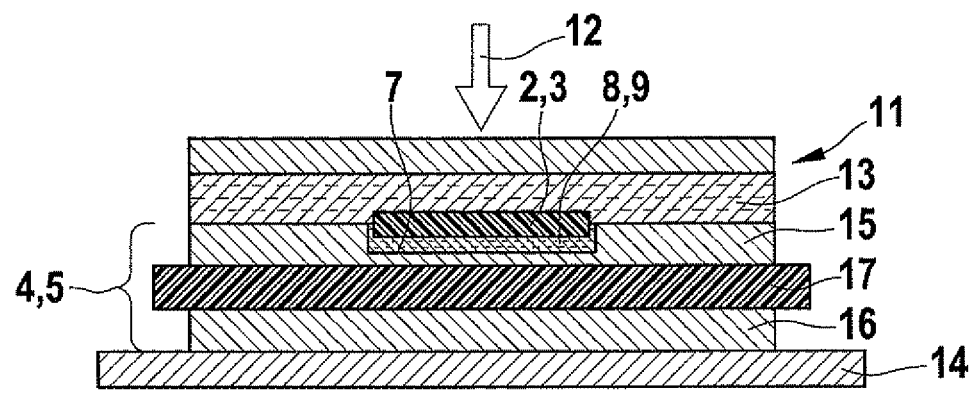
FIG. 2 shows an exemplary embodiment of an advantageous method for producing the assembly.

In the production or assembly of assembly 1, as is shown in FIG. 2, a plunger 11 applies a pressure force to component 3 in the direction of arrow 12. Plunger 11 has a plunger surface 13 that in the unloaded state is planar and that is elastically deformable, so that when pressure is applied to component 3 some areas of this component are pressed into plunger 11, as is shown in FIG. 2. Due to the elastic formation of planar plunger surface 13, a quasi-isostatic distribution of pressure against component 3 is ensured. Plunger 11 presses assembly 1 against a counter-plate 14 in order to produce the pressure force required for the sintering process.

Recess 7 is advantageously made deep enough that it can accommodate a desired quantity of sintering agent 8/silver sintering paste 9 and at least some areas of component 3. For substrate 5, all substrate types in current use are possible; a metallization 15 on the upper side must be sufficiently thick to enable realization of a sufficient current carrying capacity given the desired quantity of silver sintering paste 9. Circuit board 4, shown in section in FIGS. 1 and 2, has in addition to metallization 15 a further metallization 16 that is situated on the opposite side of a substrate bearer 17 that bears metallizations 15 and 16. Here, metallizations 15, 16 are fashioned as strip conductors.

Due to advantageous recess 7, component 3 retains its position even during the sintering process when the sintering pressure force is applied to component 3. In addition, silver sintering paste 9 is prevented from exiting onto substrate 5 in an uncontrolled manner. Silver sintering paste 9 is held in its position by recess 7. Recess 7 brings it about that, despite the poor adhesive property of silver sintering paste 9, component 3 is movable only in the frame defined by outline 10 of recess 7. Because of this, component 3 is optimally positioned even under process pressure. In the context of a circuit layout, it is therefore possible to do without extended "taboo zones," and to realize a reduction in the surface of the overall substrate 5. In addition, it is possible to omit expensive fixings of component 3 using a plunger that has an impression corresponding to component 3 and is difficult to position. Plunger 11, schematically shown in FIG. 2, is advantageously fashioned as a silicone plunger in order to ensure the elastic yielding of planar plunger surface 13. Assembly 1, as well as the advantageous method, significantly increases process security during production and thus ensures suitability for series production.

As is shown in FIGS. 3 and 4, the essentially quadratic outline 10 of recess 7 has at its corners 18 bulges 19 that act as receptacle spaces 20. Depending on the manufacturing method, bulges 19 may be required as a result of the system. However, advantageously these bulges are also provided when this is not the case in order to facilitate on the one hand the introduction of component 3 into substrate 5 and on the other hand to provide space for excess sintering agent 8 to escape. In this way, excess sintering agent 8, or silver sintering paste 9, can escape into receptacle spaces 20 without moving onto surface 6 of substrate 5. Of course, instead of circuit board 4 any other substrate, such as a pressed screen, may be used as substrate 5.

What is claimed is:

1. An assembly comprising:
    a substrate;
    at least one component;
    a first metallic strip conductor affixed to a first side of the substrate and having a recess with (i) an uniquely contoured outline corresponding to a contour of the at least one component such that the at least one component has a single orientation in the recess in which the at least one component cannot be shifted and (ii) a depth that accommodates at least some areas of the at least one component; and
    a second metallic strip conductor affixed to a second side of the substrate opposite the first side;
    wherein the at least one component is fastened on the first metallic strip conductor in the recess by sintering using a sintering agent, the sintering agent and the at least one component being situated in the recess.

2. The assembly according to claim 1, wherein the sintering agent includes sintering paste.

3. The assembly according to claim 1, wherein the recess has an outline that corresponds substantially to a contour of the component.

4. The assembly according to claim 1, wherein the sintering agent is a silver sintering paste or a solid sintering agent.

5. The assembly according to claim 1, wherein the component is an electrical/electronic component, including a power semiconductor.

6. The assembly according to claim 1, wherein the substrate is a pressed screen or a circuit board.

7. The assembly of claim 1, wherein the recess of the substrate has at least one bulge at a corner of the recess containing an excess of the sintering agent situated in the recess.

8. The assembly of claim 7, wherein the recess of the substrate has a bulge at each corner of the recess containing the excess sintering agent.

* * * * *

UNITED STATES PATENT AND TRADEMARK OFFICE
CERTIFICATE OF CORRECTION

PATENT NO. : 8,552,306 B2  Page 1 of 1
APPLICATION NO. : 12/671153
DATED : October 8, 2013
INVENTOR(S) : Wolde-Giorgis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 395 days.

Signed and Sealed this

Fifteenth Day of September, 2015

Michelle K. Lee
*Director of the United States Patent and Trademark Office*